United States Patent
Park et al.

(10) Patent No.: US 6,574,967 B1
(45) Date of Patent: Jun. 10, 2003

(54) COOLING AND HEATING APPARATUS USING THERMOELECTRIC MODULE

(75) Inventors: Rae-Eun Park, Suwon (KR); Jae-Seung Lee, Suwon (KR); Su-Il Lee, Suwon (KR)

(73) Assignee: Samsung Electronics Co., Ltd., Suwon (KR)

( * ) Notice: Subject to any disclaimer, the term of this patent is extended or adjusted under 35 U.S.C. 154(b) by 0 days.

(21) Appl. No.: 10/173,618

(22) Filed: Jun. 19, 2002

(30) Foreign Application Priority Data

Jan. 31, 2002 (KR) .......................................... 2002-5583

(51) Int. Cl.[7] ................................................ F25B 21/02
(52) U.S. Cl. ................................. 62/3.3; 62/3.6; 62/3.7; 62/428; 62/443; 62/430; 62/3.64
(58) Field of Search .............................. 62/3.6, 3.3, 3.7, 62/428, 443, 3.64, 430

(56) References Cited

U.S. PATENT DOCUMENTS

| | | | | |
|---|---|---|---|---|
| 5,099,649 A | * | 3/1992 | Zorn ........................... | 62/3.61 |
| 5,229,702 A | * | 7/1993 | Boehling et al. ............... | 320/2 |
| 5,255,520 A | * | 10/1993 | O'Geary et al. ............... | 62/3.2 |
| 5,413,166 A | * | 5/1995 | Kerner et al. .................. | 165/30 |
| 5,456,164 A | * | 10/1995 | Bang ............................ | 99/468 |
| 5,505,046 A | * | 4/1996 | Nelson et al. ................. | 62/3.6 |
| 5,621,614 A | * | 4/1997 | O'Neil ........................ | 361/698 |
| 5,927,078 A | | 7/1999 | Watanabe et al. | |
| 6,076,357 A | * | 6/2000 | Holdren et al. ............... | 62/3.2 |
| 6,463,743 B1 | * | 10/2002 | Laliberte ...................... | 62/3.3 |

* cited by examiner

*Primary Examiner*—Denise L. Esquivel
*Assistant Examiner*—Mark Shulman
(74) *Attorney, Agent, or Firm*—Staas & Halsey LLP

(57) ABSTRACT

A cooling and heating apparatus using a thermoelectric module, in which the thermoelectric module, a heat emitting member and a heat conducting block are integrated into a single unit, to improve the performance and durability of the thermoelectric module. The cooling and heating apparatus includes a thermoelectric module. The heat emitting member is attached to a first surface of the thermoelectric module. The heat conducting block is attached to a second surface of the thermoelectric module. The heat absorbing member is attached to the heat conducting block. A cover integrates the thermoelectric module and the heat conducting block into the single unit by fixedly covering side surfaces of the thermoelectric module and the heat conducting block and a part of an inner surface of the heat emitting member.

17 Claims, 5 Drawing Sheets

COOLING AND HEATING APPARATUS USING THERMOELECTRIC MODULE

CROSS-REFERENCE TO RELATED APPLICATIONS

This application claims the benefit of Korean Application No. 2002-5583, filed Jan. 31, 2002, in the Korean Intellectual Property Patent Office, the disclosure of which is incorporated herein by reference.

BACKGROUND OF THE INVENTION

1. Field of the Invention

The present invention relates generally to a cooling and heating apparatus using a thermoelectric module, and more particularly to a cooling and heating apparatus using the thermoelectric module, in which the thermoelectric module, a heat emitting member and a heat conducting block are integrated into a single unit, so that the thermoelectric module can be easily assembled with other component parts while being sealed up, thereby improving the performance and durability of the thermoelectric module.

2. Description of the Related Art

A thermoelectric module is a device that is constructed by combining two dissimilar metals together or joining an n-type semiconductor and a p-type semiconductor together. A thermoelectric module has characteristics that when current is applied thereto, heat absorbing and heat emitting actions occur on opposite surfaces of the two dissimilar metals or n-type and p-type semi-conductors, respectively. As a result, if a heat exchanger is installed in the heat absorbing side of the thermoelectric module, surroundings corresponding to the heat absorbing side of the thermoelectric module can be cooled. In contrast, when a heat exchanger is installed in the heat emitting side of the thermoelectric module, surroundings corresponding to the heat emitting side of the thermoelectric module can be heated.

Cooling technology using a thermoelectric module can prevent environmental disruption by the leakage of refrigerant gas such as Freon gas because surroundings can be cooled without the use of refrigerant gas, which is generally used in a refrigeration cycle, and can eliminate operational noise because a driving device such as a compressor used to compress refrigerant gas is not necessary. Further, the size of the thermoelectric module is relatively small, so that the installation of the thermoelectric module is easy and a product using the thermoelectric module can be of a compact construction.

In general, where a temperature around the heat emitting side of a thermoelectric module is approximately 30° C., the temperature around the heat absorbing side thereof can be maintained at a temperature of approximately 3° C. If the temperature around the heat emitting side of the thermoelectric module is decreased, the temperature around the heat absorbing side thereof can be lowered. Accordingly, if the size of current supplied to the thermoelectric module and the supply time of the current are controlled with the heat absorbing side of the thermoelectric module disposed inside of a storage space and the heat emitting side thereof disposed outside of the storage space, the storage space can be refrigerated or cooled, thereby allowing the thermoelectric module to be used in conjunction with a small-sized refrigerator, a kimchi refrigerator, and a medical thermostat.

However, if the heat emitting side of the thermoelectric module is disposed inside of a storage space and the heat absorbing side thereof is disposed outside of the storage space, the temperature of the storage space can be increased, thereby allowing the thermoelectric module to be used in conjunction with a product such as a heating cabinet or heating apparatus.

FIG. 1 is a longitudinal section of a conventional cooling and heating apparatus using a thermoelectric module. As shown in FIG. 1, the conventional cooling and heating apparatus using a thermoelectric module comprises a thermoelectric module 11 and a heat conducting block 12 disposed in a partition wall 3 that separates a cooling space 1 and a heating space 2 from each other, a heat absorbing member 13 disposed in the cooling space 1 to absorb heat from surroundings of the cooling space 1 and cool the surroundings of the cooling space 1, and a heat emitting member 14 disposed in the heating space 2 to emit heat to surroundings of the heating space 2 and heat the surroundings of the heating space 2.

A thin aluminum plate 15 is positioned between the thermoelectric module 11 and the heat emitting element 14 to allow the heat emitting member 14 to be assembled to the thermoelectric module 11. A thermal conductive adhesive adheres opposite surfaces of the aluminum plate 15 to the thermoelectric module 11 and the heating emitting member 14, respectively.

Further, thermally conductive adhesives 16 are applied between the thermoelectric module 11 and the heat conducting block 12 and between the heat conducting block 12 and the heat absorbing member 13. The heat absorbing member 13 is fixedly attached to the heat conducting block 12 by a plurality of screws 17, while the heat emitting member 14 is fixedly attached to the partition wall 3 by a plurality of screws 18.

A pair of electric wires 19 is connected to an upper end and a lower end of the thermoelectric module 11 to apply current to the thermoelectric module 11.

However, the conventional cooling and heating apparatus using the thermoelectric module constructed as described above is disadvantageous in that thermally conductive adhesives of thermosetting material are applied between the thermoelectric module and the heat conducting block and between the heat absorbing member and the heat emitting member. Consequently, an excessively long assembly time is required because several heat treatment processes are necessary and the thermally conductive adhesives are applied by hand, and products of uniform quality cannot be manufactured because cooling and heating characteristics vary according to the quantity of the thermally conductive adhesive.

Further, the conventional thermoelectric module is positioned in the partition wall without a sealing means and a considerable temperature difference between opposing surfaces of the thermoelectric module is generated while the thermoelectric module is being operated, thus moisture is condensed from the air around the conventional thermoelectric module The moisture reacts with the conventional thermoelectric module, thus causing a problem that the moisture corrodes the conventional thermoelectric module. Also, moisture infiltrates the thermoelectric module through the pair of electric wires, so corrosion of the conventional thermoelectric module is intensified.

As a result, the performance of the thermoelectric module is decreased and the life span thereof is reduced, thus reducing the reliability of the conventional thermoelectric module.

In addition, the conventional cooling and heating apparatus using the thermoelectric module has a construction in which the thermoelectric module is installed through the partition wall with the thermoelectric module attached to the thin aluminum plate and the heat emitting member is assembled to the aluminum plate by screws, so that integration of the component parts into a single unit is difficult and, accordingly, torques are not uniformly exerted on the screws during the assembly of the components parts, thus causing the cooling and heating performances of the apparatus to be non-uniform.

Furthermore, the thermal resistivity of the conventional cooling and heating apparatus is increased by the above-mentioned structure of the conventional cooling and heating apparatus, so heat generated from the thermoelectric module is not smoothly transferred to the heat emitting member, thus deteriorating the performance of the conventional cooling and heating apparatus.

SUMMARY OF THE INVENTION

Accordingly, a cooling and heating apparatus a thermoelectric module, which] is manufactured with a thermoelectric module, a heat emitting member and a heat conducting block integrated into a single unit, thereby improving the assemblibility, durability and cooling and heating performances thereof.

Another object of the present invention is to provide a cooling and heating apparatus using a thermoelectric module, in which the thermoelectric module of the cooling and heating apparatus is completely sealed off from the outside air.

A further object of the present invention is to provide a cooling and heating apparatus using a thermoelectric module, which has a construction to allow thermal resistivity of the apparatus to be minimized.

Additional objects and advantages of the invention will be set forth in part in the description which follows and, in part, will be obvious from the description, or may be learned by practice of the invention.

In order to accomplish the above and other objects, the present invention provides a cooling and heating apparatus, comprising a thermoelectric module, a heat emitting member attached to a first surface of the thermoelectric module, a heat conducting block attached to a second surface of the thermoelectric module, a heat absorbing member attached to the heat conducting block, and a cover integrating the thermoelectric module and the heat conducting block into a single unit by fixedly covering side surfaces of the thermoelectric module and the heat conducting block and a part of an inner surface of the heat emitting member.

Each pair of the thermoelectric module and the heat conducting block, the thermoelectric module and the heat emitting member, and the heat conducting block and the heat absorbing member may adhere to each other by a thermally conductive adhesive.

The cooling and heating apparatus may further comprise a first sealing material disposed between the cover and side surfaces of the heat conducting block and a second sealing member disposed between the cover and an inner surface of the heat emitting member, so as to seal off the thermoelectric module from outside air.

The first and second sealing materials may be epoxy resins.

The heat conducting block may be provided along side surfaces of the heat conducting block with an interlocking step and an interlocking groove and the cover is provided at a front end of the cover with an interlocking projection, so that the interlocking projection of the cover is interlocked with the interlocking step of the heat conducting block and the interlocking step and the interlocking groove of the heat conducting block are covered with the first sealing material.

The cover is provided at a rear end of the cover with a flange portion outwardly extended, a pair of ribs are formed on each section of a surface of the flange portion, and the cover is attached to the heat emitting member by bolts with each of the bolts being inserted between ones of each pair of ribs, respectively.

The cooling and heating apparatus may further comprise a pair of electric wires connected to the thermoelectric module, wherein the electric wires are embedded in the second sealing material between the cover and the heat emitting member with coatings removed from the pair of the electric wires.

BRIEF DESCRIPTION OF THE DRAWINGS

These and other objects and advantages of the invention will become apparent and more readily appreciated from the following description of the preferred embodiments, taken in conjunction with the accompanying drawings of which.

DETAILED DESCRIPTION OF THE PREFERRED EMBODIMENTS

Figure 1:
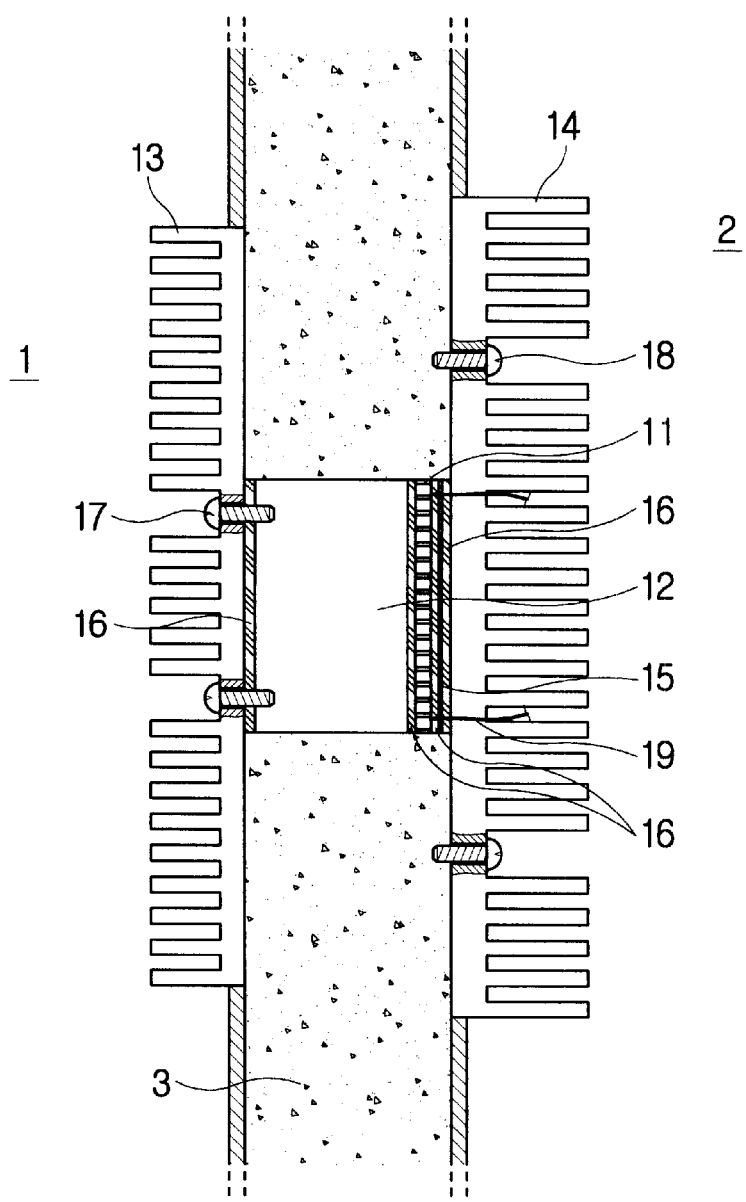
FIG. 1 is a longitudinal sectional view of a conventional cooling and heating apparatus using a thermoelectric module.

Reference will now made in detail to the present preferred embodiments of the present invention, examples of which are illustrated in the accompanying drawings, wherein like reference numerals refer to the like elements throughout. The embodiments are described below in order to explain the present invention by referring to the figures.

Figure 2:
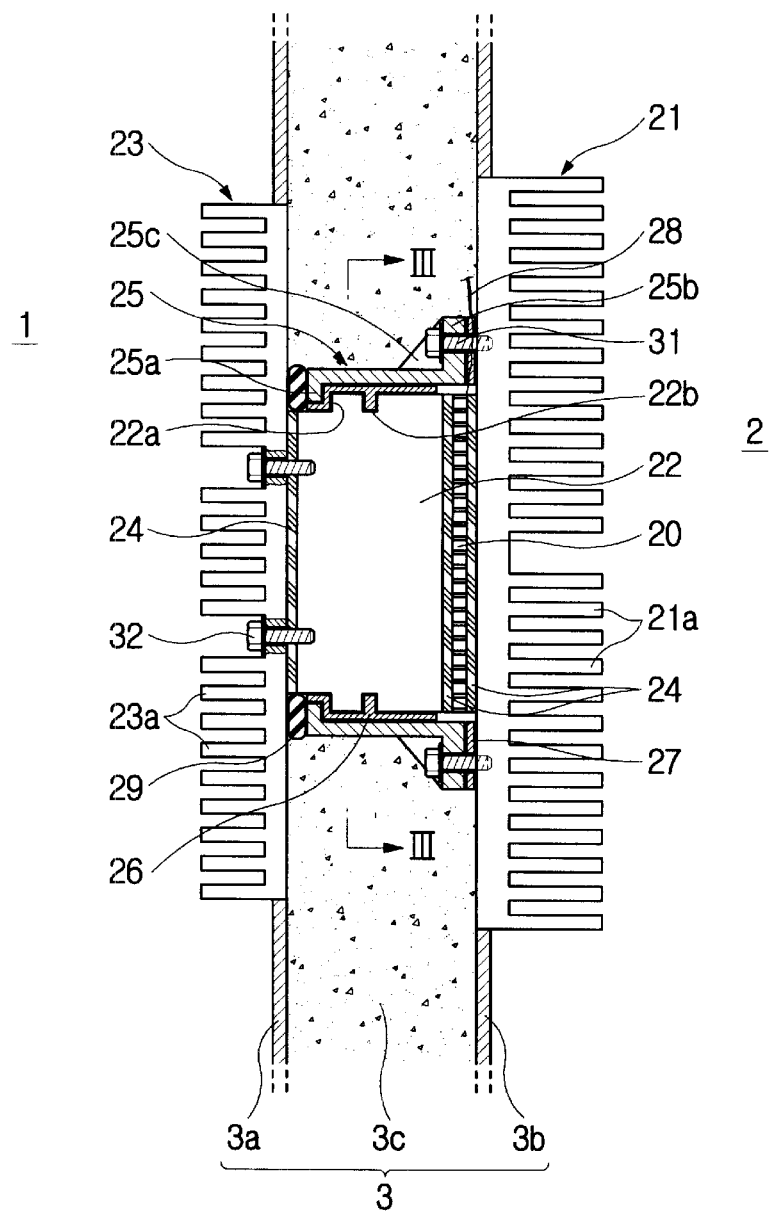
FIG. 2 is a longitudinal sectional view of a cooling and heating apparatus using a thermoelectric module in accordance with a first embodiment of the present invention, with a heat absorbing member of the cooling and heating apparatus comprising a heat exchange block having a plurality of fins.
Figure 3:
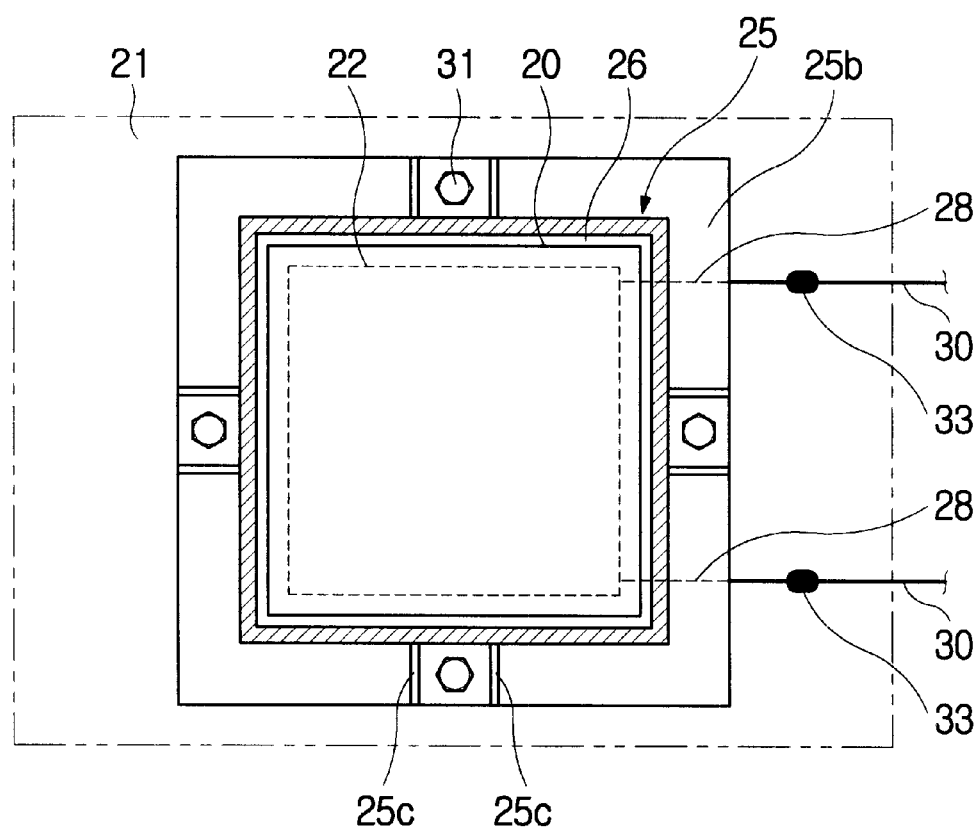
FIG. 3 is a cross sectional view taken along line III—III of FIG. 2.

FIGS. 2 and 3 are views of a cooling and heating apparatus a thermoelectric module. in accordance with a first embodiment of the present invention, FIG. 2 being a longitudinal sectional view of the cooling and heating apparatus and FIG. 3 being a cross sectional view taken along line III—III of FIG. 2.

As shown in FIG. 2, the cooling and heating apparatus using a thermoelectric module comprises a thermoelectric module 20, a heat emitting member 21 in contact with a heat emitting side of the thermoelectric module 20, a heat conducting block 22 in contact with a heat absorbing side of the thermoelectric module 20, and a heat absorbing member 23 adapted to communicate with the heat absorbing side of the thermoelectric module 20 through a medium of the heat conducting block 22.

Thermally conductive adhesives 24 are applied between the thermoelectric module 20 and the heat emitting member 21, between the thermoelectric module 20 and the heat conducting block 22 and between the heat conducting block 22 and the heat absorbing member 23, so that respective parts of the heating and cooling apparatus adhere to one another to allow heat to be conducted therethrough. The thermally conductive adhesives 24 may be manufactured by adding thermally conductive powder to oil.

A cover 25 is positioned to surround side surfaces of the heat conducting block 22 and the thermoelectric module 20 so that the thermoelectric module 20 is separated from the outside and the thermoelectric module 20, the heat conducting block 22 and the heat emitting member 21 are integrated into a single unit. Further, to separate the thermoelectric module 20 from the outside air, a first sealing material 26 and a second sealing material 27 are applied between the heat conducting block 22 and the cover 25 and between the heat emitting member 21 and the cover 25, respectively.

In order to easily and tightly hold the cover 25 and the first sealing material 26, an interlocking step 22a and an interlocking groove 22b are formed along the side surfaces of the heat conducting block 22. The first sealing material 26 is applied to the side surfaces of the heat conducting block 22 on which the interlocking step 22a and the interlocking groove 22b are formed. An interlocking projection 25a is formed by radially inwardly bending a front end of the cover 25, and fixedly interlocking with the interlocking step 22a.

A flange portion 25b having a plurality of bolt holes is radially outwardly extended at a rear end of the cover 25. The second sealing material 27 is situated between the flange portion 25b of the cover 25 and the heat emitting member 21.

Accordingly, the heat emitting member 21 is fixedly attached to the cover 25 by a plurality of bolts 31 inserted into the bolt holes in the flange portion 25b of the cover 25, with the second sealing material 27 being interposed between the heat emitting member 21 and the cover 25. In order to reinforce the flange portion 25b of the cover 25, a plurality of pairs of ribs 25c are formed on the flange portion 25b of the cover 25.

A pair of electric wires 28 adapted to supply current to the thermoelectric module 20 are extended to the outside from the cover 25 through the second sealing material 27.

Similar to the heat emitting member 21, the heat absorbing member 23 is fixedly attached to the heat conducting block 22 by a plurality of bolts 32. A sealing ring 29, which is made of a material such as silicon, is disposed in a gap between the cover 25 and the heat absorbing member 23.

The cooling and heating apparatus using a thermoelectric module 20 in accordance with the first embodiment of the present invention is mainly positioned in a partition wall 3 that separates the cooling and heating spaces 1 and 2, respectively, from each other. In more detail, the thermoelectric module 20, the heat conducting block 22 and the cover 25 are situated in the partition wall 3, the heat emitting member 21 is oriented toward the heating space 2 on an outer surface of the heat emitting member 21, and the heat absorbing member 23 is oriented toward the cooling space 2 on an outer side of the heat absorbing member 23.

In order to improve the thermal conductivities of the heat absorbing and emitting members 23 and 21, a plurality of fins 23a and 21a are formed on the outer sides of the heat absorbing and emitting members 23 and 21, respectively. Although not shown in the drawings, two fans can be installed in the vicinity of the heat absorbing and emitting members 23 and 21, respectively, so as to allow heat exchange to be effectively carried out.

The partition wall 3 comprises an inner panel 3a positioned in contact with the cooling space 1, an outer panel 3b positioned in contact with the heating space 2, and an insulating member 3c, for example made of urethane, that is foamed between the inner and outer panels 3a and 3b with the cooling and heating apparatus of the present invention installed through the inner and outer panels 3a and 3b.

FIG. 3 is a view showing the mounting of the cover 25 onto the heat conducting block 22 and the heat emitting member 21 so as to seal up the thermoelectric module 20. As illustrated in the drawing, a front surface of the thermoelectric module 20 is brought into contact with the heat conducting block 22, side surfaces of the thermoelectric module 20 are sealed off from the outside by the first sealing material 26 and the cover 25, and a rear surface of the thermoelectric module 20 is sealed off from the outside by the second sealing member 27 (see FIG. 2) and the flange portion 25b of the cover 25. As described above, the pairs of ribs 25c are formed on the flange portion 25b of the cover 25 so as to reinforce the flange portion 25b of the cover 25. A bolt 31 is inserted between each of the pairs of ribs 25c.

The pair of electric wires 28, which are connected to the thermoelectric module 20 and embedded in the flange portion 25b of the cover 25 with their coatings removed therefrom, are connected by solder 33 to another, respective pair of electric wires 30 that are connected to an exterior electric source outside of the cover 25, thus supplying current to the thermoelectric module 20.

As described above, the pair of electric wires 28 connected to the thermoelectric module 20 are fixedly embedded in the second sealing material 27 with their coatings removed, so that moisture is prevented from infiltrating the thermoelectric module 20 through the electric wires 30.

Hereinafter, a process is described in which the thermoelectric module 20, the heat emitting member 21 and the heat conducting block 22 of the cooling and heating apparatus are integrated into a single unit by the cover 25 and the first and second sealing materials 26 and 27.

First, the thermally conductive adhesives 24 are applied between the heat emitting side of the thermoelectric module 20 and the heat emitting member 21 and between the heat absorbing side of the thermoelectric module 20 and the heat conducting block 22, thus attaching the thermoelectric module 20, the heat emitting member 21 and the heat conducting block 22 to one another. The first sealing material 26, for example, made of epoxy resin, is applied to the side surfaces of the heat conducting block 22 on which the interlocking step 22a and the interlocking groove 22b are formed, while the second sealing material 27, for example, made of epoxy resin, is applied to an inner surface of the heat emitting member 21.

Thereafter, with the interlocking projection 25a of the cover 25, for example, made of glass fiber reinforced epoxy resin, in a form shown in FIGS. 2 and 3 being interlocked with the interlocking step 22a of the heat conducting block 22 coated with the first sealing material 26, and with the flange portion 25b of the cover 25 being brought into contact with a portion of the heat emitting member 21 coated with the second sealing material 27, the cover 25 is combined with the heat emitting member 21 by tightening the bolts 31 with a torque driver (not shown) while pressing the cover 25 with a pressure jig (not shown) so as to maintain a constant assembly pressure.

In the above assembly process, as the first and second sealing materials harden, each pair of the cover 25 and the heat conducting block 22 and the cover 25 and the heat emitting member 21 are securely combined with each other, thereby completely sealing the thermoelectric module 20 off from the outside air.

In such a case, the assembly pressure may be determined to have a magnitude that exerts a minimum amount of stress to the thermoelectric module 20 even while the thermoelectric module 20 is under thermal expansion and thermal contraction.

With the heat emitting member 21, the heat conducting block 22 and the cover 25 being assembled together, the heat absorbing member 23 is fixedly attached to the front surface of the heat conducting block 22 by the bolts 32, thereby completing the assembly of the cooling and heating apparatus.

After the completed cooling and heating apparatus is installed through the partition wall 3 which separates the cooling and heating spaces 1 and 2 from each other, the insulating member 3c, such as urethane foam, is foamed between the inner and outer panels 3a and 3b, thereby completing the installation of the cooling and heating apparatus using a thermoelectric module.

When direct current is applied to the cooling and heating apparatus through the electric wires 28 and 30 after the cooling and heating apparatus is installed as described above, the heat absorbing side of the thermoelectric module 20 in contact with the heat conducting block 22 is cooled, and the heat conducting block 22 and the heat absorbing member 23 are cooled by heat conduction, thereby cooling the cooling space 1 and maintaining the cooling space 1 at a low temperature. At the same time, the heat emitting side of the thermoelectric module 20 in contact with the heat emitting member 21 is heated and heats the heat emitting member 21, thereby heating the heating space 2 and maintaining the heating space 2 at a high temperature.

Figure 4:
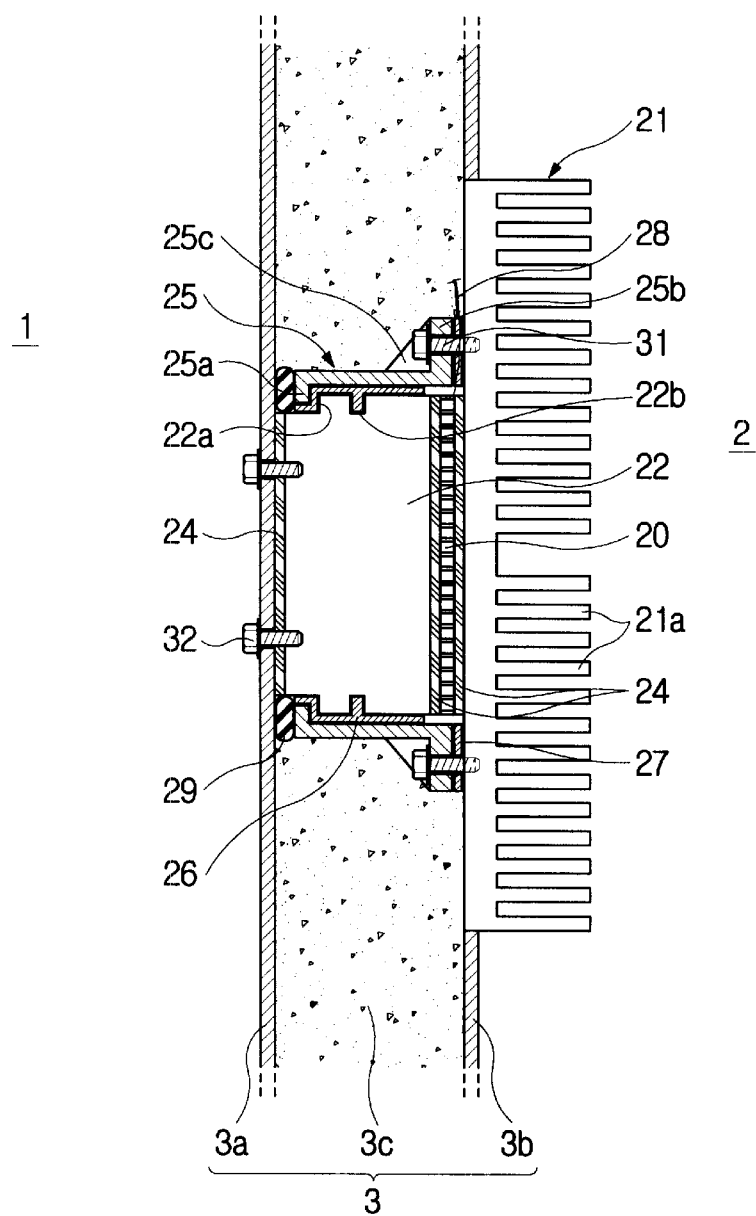
FIG. 4 is a longitudinal sectional view of a cooling and heating apparatus using a thermoelectric module in accordance with a second embodiment of the present invention, with a heat absorbing member of the cooling and heating apparatus comprising a metallic partition wall separating surrounding spaces.

FIG. 4 is a longitudinal section of a cooling and heating apparatus using a thermoelectric module in accordance with a second embodiment of the present invention. As shown in FIG. 4, the cooling and heating apparatus of the second embodiment includes a part corresponding to the heat emitting member 23 of the first embodiment which is incorporated with an inner panel 3a of the partitiori wall 3 fabricated of a metallic material, and is brought into direct contact with a heat conducting block 22. Accordingly, the heat absorption of the thermoelectric module 20 cools the heat conducting block 22, and the inner panel 3a of the partition wall 3 is cooled by the heat conduction of the heat conducting block 22, thus cooling a cooling space 1.

The other elements with the exception of the part corresponding to the heat emitting member are the same as the corresponding elements of the second embodiment, so further description of the elements is omitted.

Figure 5:
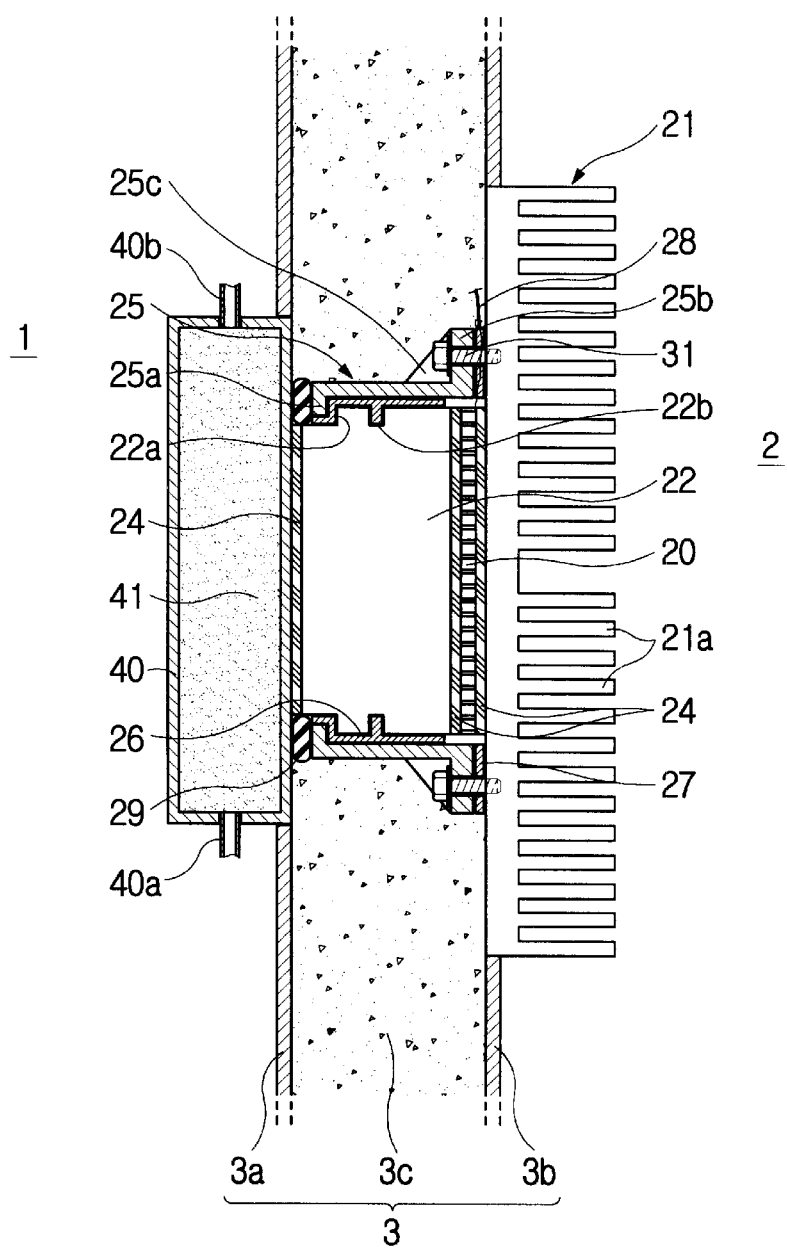
FIG. 5 is a longitudinal sectional view of a cooling and heating apparatus using a thermoelectric module in accordance with a third embodiment of the present invention, with a heat absorbing member of the cooling and heating apparatus comprising a cooling fluid tank accommodating a cooling fluid.

FIG. 5 is a longitudinal section of a cooling and heating apparatus using a thermoelectric module in accordance with a third embodiment of the present invention. As shown in FIG. 5, the cooling and heating apparatus of the third embodiment includes an element corresponding to the heat absorbing member 23 of the first embodiment comprising a cooling fluid tank 40 and is attached to a heat conducting block 22. A cooling fluid outlet 40a and a cooling fluid inlet 40b are formed on a lower end and an upper end of the cooling fluid tank 40, respectively.

As a result, the heat conducting block 22 is cooled by the heat absorption of the thermoelectric module 20, and the cooling fluid accommodated in the cooling fluid tank 40 is cooled by the heat conduction of the heat conducting block 22. Thereafter, a cooling fluid of a low temperature flows out of the cooling fluid tank 40 through the cooling fluid outlet 40a, undergoes heat exchange through a heat exchanger (not shown) and a fan (not shown), and flows into the cooling fluid tank 40 through the cooling fluid inlet 40b of the cooling fluid tank 40. The cooling fluid 41 repeats the above-described cycle. During cycles of the cooling fluid 41 through the cooling fluid tank 40 and the heat exchanger, the cooling fluid 41 cools the cooling space 1.

The other elements with the exception of the cooling fluid tank 40, cooling fluid inlet 40b, cooling fluid outlet 40a and cooling fluid 41 are the same as the corresponding elements of the first embodiment, so further description of the elements is omitted.

As described above, the present invention provides the cooling and heating apparatus using a thermoelectric module, in which the thermoelectric module, the heat emitting member and the heat conducting block are integrated in a single unit, so that the assembly of the cooling and heating apparatus is improved, thereby allowing products of uniform performance to be manufactured on a large scale.

In addition, the cooling and heating apparatus using a thermoelectric module, in which the thermoelectric module is completely sealed off from the outside air is provided, so the thermoelectric module is prevented from corroding by infiltration of moisture, thereby maintaining excellent performance of the thermoelectric module and lengthening a life span of the thermoelectric module.

In addition, the cooling and heating apparatus using a thermoelectric module, in which the thermoelectric module and the heat emitting member are directly attached to each other without using an additional member is provided, so that a thermal resistivity interface can be minimized, thereby improving the performance of the cooling and heating apparatus.

Although a few preferred embodiments of the present invention have been shown and described, it would be appreciated by those skilled in the art that changes may be made in this embodiment without departing from the principles and spirit of the invention, the scope of which is defined in the claims and their equivalents.

What is claimed is:

1. A cooling and heating apparatus, comprising:
   a thermoelectric module;
   a heat emitting member attached to a first surface of the thermoelectric module;
   a heat conducting block attached to a second surface of the thermoelectric module;
   a heat absorbing member attached to the heat conducting block; and
   a cover integrating the thermoelectric module and the heat conducting block into a single unit by fixedly covering side surfaces of the thermoelectric module and the heat conducting block and a part of an inner surface of the heat emitting member.

2. The cooling and heating apparatus according to claim 1, wherein each pair of the thermoelectric module and the heat conducting block, the thermoelectric module and the heat emitting member, and the heat conducting block and the heat absorbing member, respectively, adhere to each other by a thermally conductive adhesive.

3. The cooling and heating apparatus according to claim 2, further comprising:

a first sealing material disposed between the cover and the side surfaces of the heat conducting block; and a second sealing material disposed between the cover and an inner surface of the heat emitting member, so as to seal off the thermoelectric module from outside air.

4. The cooling and heating apparatus according to claim 3, wherein the first sealing material and the second sealing material are epoxy resins.

5. The cooling and heating apparatus according to claim 3, wherein the heat conducting block is provided along the side surfaces of the heat conducting block with an interlocking step and an interlocking groove and the cover is provided at an end of the cover with an interlocking projection, so that the interlocking projection of the cover is interlocked with the interlocking step of the heat conducting block and the interlocking step and the interlocking groove of the heat conducting block are covered with the first sealing material.

6. The cooling and heating apparatus according to claim 3, wherein the cover is provided at an end of the cover with a flange portion outwardly extended, a pair of ribs are formed on each section of a surface of the flange portion, and the cover is attached to the heat emitting member by bolts with each of the bolts being inserted between ones of each pair of ribs, respectively.

7. The cooling and heating apparatus according to claim 3, further comprising:

a pair of electric wires electrically connected to the thermoelectric module, wherein the electric wires are embedded in the second sealing material between the cover and the heat emitting member with coatings removed from the electric wires.

8. The cooling and heating apparatus according to claim 1, wherein the heat emitting member and the thermoelectric module are directly attached to each other, thereby reducing thermal resistivity.

9. The cooling and heating apparatus according to claim 1, wherein the cover, the thermoelectric module and the heat conducting block form a construction unit.

10. The cooling and heating apparatus according to claim 2, wherein the thermally conductive adhesive is produced by adding thermally conductive powder to oil.

11. A cooling and heating apparatus, comprising:

a thermoelectric module absorbing heat from a first space and emitting heat to a second space in response to current supplied to the thermoelectric module; and a cover unit to cover the thermoelectric module, while conducting heat therethrough for both the first and second spaces, respectively, wherein the cover unit seals off the thermoelectric module from both external air and external moisture.

12. The cooling and heating apparatus according to claim 11, further comprising:

a pair of electric wires electrically connected to the thermoelectric module, wherein the electric wires are embedded in a sealing material passing through the cover unit with coatings removed from both of the electric wires.

13. The cooling and heating apparatus according to claim 11, wherein the cover unit further comprises:

a heat emitting member attached to a first surface of the thermoelectric module;

a heat conducting block attached to a second surface of the thermoelectric module; and a heat absorbing member attached to the heat conducting block.

14. The cooling and heating apparatus according to claim 13, wherein each pair of the thermoelectric module and the heat conducting block, the thermoelectric module and the heat emitting member, and the heat conducting block and the heat absorbing member, adhere to each other by a thermally conductive adhesive.

15. A cooling and heating apparatus, comprising:

a thermoelectric module absorbing heat from a first space and emitting heat to a second space in response to current supplied to the thermoelectric module;

a pair of insulated wires supplying current to the thermoelectric module; and a cover unit covering the thermoelectric module, while conducting heat therethrough for both the first and second spaces, respectively, the pair of insulated wires passing through the cover unit to supplying the current to the thermoelectric module, a sealant provided around the pair of insulated wires and the cover unit to seal off the insulated wires, and the pair of insulated wires having an insulation removed corresponding to the portion of each of the insulated wires passing through the cover unit so as to prevent moisture from infiltrating into the thermoelectric module.

16. The cooling and heating apparatus according to claim 15, wherein the thermoelectric module is sealed off from both external air and external moisture.

17. A cooling and heating apparatus, comprising:

a thermoelectric module;

a heat emitting member attached to a first surface of the thermoelectric module;

a heat conducting block attached to a second surface of the thermoelectric module;

a cooling fluid tank having a cooling fluid outlet and a cooling fluid inlet formed on a lower end and an upper end of the cooling fluid tank, respectively, attached to the heat conducting block to cool the cooling fluid which circulates through the cooling fluid tank by way of the cooling fluid inlet of the cooling fluid tank and cooling fluid outlet of the cooling fluid tank; and a cover integrating the thermoelectric module and the heat conducting block into a single unit by fixedly covering side surfaces of the thermoelectric module and the heat conducting block and a part of an inner surface of the heat emitting member.

* * * * *

UNITED STATES PATENT AND TRADEMARK OFFICE
CERTIFICATE OF CORRECTION

PATENT NO.    : 6,574,967 B1
DATED         : June 10, 2003
INVENTOR(S)   : Rae-eun Park et al.

It is certified that error appears in the above-identified patent and that said Letters Patent is hereby corrected as shown below:

Column 9,
Line 7, after "the" delete ","
Line 18, after "the" (first occurrence) delete ","

Signed and Sealed this

Ninth Day of December, 2003

JAMES E. ROGAN
*Director of the United States Patent and Trademark Office*